(12) United States Patent
Yun et al.

(10) Patent No.: US 11,463,097 B2
(45) Date of Patent: Oct. 4, 2022

(54) CPT PHASE MODULATION AND DEMODULATION METHOD AND SYSTEM

(71) Applicant: National Time Service Center (NTSC), Chinese Academy of Science (CAS), Xi'an (CN)

(72) Inventors: Enxue Yun, Xi'an (CN); Qinglin Li, Xi'an (CN); Qiang Hao, Xi'an (CN); Guobin Liu, Xi'an (CN); Yuping Gao, Xi'an (CN); Shougang Zhang, Xi'an (CN)

(73) Assignee: National Time Service Center (NTSC), Chinese Academy of Science (CAS), Xi'an (CN)

( * ) Notice: Subject to any disclaimer, the term of this patent is extended or adjusted under 35 U.S.C. 154(b) by 0 days.

(21) Appl. No.: 17/215,057

(22) Filed: Mar. 29, 2021

(65) Prior Publication Data

US 2022/0173743 A1    Jun. 2, 2022

(30) Foreign Application Priority Data

Oct. 28, 2020   (CN) .......................... 202011168735.7

(51) Int. Cl.
*H03L 7/26* (2006.01)
*G04F 5/14* (2006.01)

(52) U.S. Cl.
CPC ................ *H03L 7/26* (2013.01); *G04F 5/145* (2013.01)

(58) Field of Classification Search
CPC .......................................................... H03L 7/26
USPC .......................................................... 331/94.1
See application file for complete search history.

(56) References Cited

U.S. PATENT DOCUMENTS 6,320,472 B1 *   11/2001   Vanier .................... G04F 5/145
                                                        331/94.1
2009/0289728 A1 * 11/2009   Ben-Aroya ............... H03L 7/26
                                                        331/94.1

* cited by examiner

*Primary Examiner* — Joseph Chang
(74) *Attorney, Agent, or Firm* — Houtteman Law LLC

(57) ABSTRACT

The invention relates to a coherent population trapping (CPT) phase modulation and demodulation method and a system for implementing the method of this invention. The method comprises the following steps: Generating a coherent bichromatic light, in which the relative phase between the two frequency components is modulated with proper modulation depth. The phase modulated coherent bichromatic light interacts with a quantum resonance system, and prepares it alternately into two inverted CPT states. Detecting the transmitted light with a photodetector, two inverted dispersive CPT signals in two detection windows are observed. With synchronous phase demodulation, a CPT error signal is obtained, which is used for locking the local oscillator to implement a CPT atomic clock.

6 Claims, 7 Drawing Sheets

CPT PHASE MODULATION AND DEMODULATION METHOD AND SYSTEM

CROSS REFERENCES OF RELATED APPLICATIONS

The present application claims the priority of the Chinese patent application No. CN202011168735.7 filed on Oct. 28, 2020. The contents of the above identified applications are incorporated herein by reference in their entireties.

FIELD

The present invention relates generally to the field of atomic clocks, atomic magnetometers, atomic spectroscopy, and specifically to an error signal generation technique for coherent population trapping (CPT).

BACKGROUND

CPT is a quantum interference effect. The passive configuration of CPT is known for the advantage of microwave cavity free, thus being adopted to implement compact and chip-scale atomic clocks (CSAC) and chip-scale atomic magnetometers (CSAM).

The passive CPT based vapor cell atomic clock is taken as an example to illustrate the background of the application of the present invention.

Currently in a CPT atomic clocks based on continuous light interaction, in order to lock the local oscillator (LO) frequency to CPT resonance and further realize an atomic clock, two methods can be adopted: side of fringe locking or top of line locking. The former is not commonly adopted due to poor signal-to-noise ratio, while the latter way is widely used owing to the fact that low frequency noise, such as pink noise (1/f noise), is greatly suppressed and the signal-to-noise ratio is much higher than former.

For the top of line locking, a first derivate signal of CPT resonance is required, which serves as frequency discriminator for the LO and denoted hereafter as error signal.

The error signal of CPT resonance signal is obtained by frequency modulation and demodulation method.

In this method, initially a continuous coherent bichromatic light is generated, in which the beat-note is frequency modulated, wherein the modulation depth is the half linewidth of a CPT resonance line (10 Hz~1 kHz) and the modulation rate is typically larger than 100 Hz. Further, the frequency modulated coherent bichromatic light interacts with a quantum resonance system and prepares it into a CPT state. And then the transmitted light from the quantum resonance system is detected by a photodetector and converted into an electric signal. With synchronous demodulation, which is realized by multiplying a square-wave signal synchronous with the frequency modulation, and filtering of the high-frequency components by a low-pass filter, an error signal of CPT resonance signal is obtained.

This method puts high demands on the microwave source, i.e. high frequency resolution is required in the case of small frequency modulation depth. Especially for a CSAC, which is severely restricted by the size, weight, power consumption and cost, thus it generally adopts a phase-locked loop (PLL) and a voltage controlled oscillator (VCO) to generate microwaves. However, the choice of PLL is crucial and the option is very limited. Take the $^{87}$Rb CPT atomic clock modulated by half-wave (3.417 GHz) for example, the frequency resolution of PLL typically needs to be less than 50 Hz.

SUMMARY

In order to overcome the defects of frequency modulation and demodulation in the prior art, the invention discloses a CPT phase modulation and demodulation method which can lower the requirements for frequency resolution of microwave synthesizer.

The method adopted by the invention for solving the technical problem comprises the following steps:
1) providing a coherent bichromatic light.
2) modulating the relative phase between the two frequency components in the coherent bichromatic light, wherein the modulation depth is $\pi/2$.
3) interacting the phase modulated coherent bichromatic light with a quantum resonance system, then the quantum resonance system is prepared alternately into two inverted dispersive CPT states.
4) converting coherent bichromatic light transmitted from the quantum resonance system into an electric signal by a photodetector, demodulating the electric signal to obtain an error signal, feeding back and locking the local oscillation frequency, and realizing an atomic clock.

The quantum resonance system comprises a CPT resonance energy level structure from two ground states to the same excited state, and adapts to hydrogen atoms (H), alkali metals (Li, Na, K, Rb, Cs), Hg$^+$, Ca$^+$, Yb$^+$, Ba$^+$ or fullerene (C-60) particles. The particles being in a gaseous hot atom, gaseous cold atom, gaseous atomic beam, ion, molecular or plasma state.

The relative phase modulation in the step 2) is switched between $\phi+0$ and $\phi+\pi/2$, wherein $\phi$ is an initial arbitrary phase.

The modulation period of the relative phase modulation in the step 2) is at the same order of the ground states coherence time, for maximizing the contrast of CPT signal.

Clock transitions obtained by the method, i.e. $|m_F=0\rangle \rightarrow |m'_F=0\rangle$, wherein $m_F$ and $m'_F$ are magnetic quantum numbers of two ground-state quantum levels, the CPT error signal of which is applied to the CPT atomic clock; non-clock transitions, i.e. $|m_F\neq 0\rangle \rightarrow |m'_F\neq 0\rangle$, the CPT error signal is applied to the atomic magnetometer; both clock and non-clock transition CPT error signals can be applied to atomic precision spectroscopy.

The invention also discloses a CPT phase modulation and demodulation device for realizing the method, which comprises a direct current source, a microwave coupler (biastee), a phase modulator, a microwave signal source, a laser diode, a quarter-wave plate, a quantum resonance system, a detector and a signal processor.

The direct current source supplies power to the laser diode; a microwave signal source sends phase modulated microwave signal by a phase modulator to the laser diode through a microwave coupler; coherent bichromatic light emitted by the laser diode passes through a quarter-wave plate to obtain circularly polarized coherent bichromatic light. After it interacts with the quantum resonance system, transmitted light is detected by a photodetector, thus an optical signal is converted into an electric signal, and finally a CPT error signal of phase modulation and demodulation is obtained through a signal processor.

The quantum resonance system adapts to an active CPT or passive CPT configuration.

The coherent bichromatic light can be circularly polarized laser light (σσ CPT), a pair of parallel and linearly polarized laser light (lin//lin CPT), a pair of orthogonally and linearly polarized laser light (lin⊥lin CPT), push-pull optical pumping CPT (PPOP CPT) or double modulation CPT (DM CPT).

The invention has the beneficial effects that:

1. There is no frequency but a phase modulation, thus the invention offers a new design concept for microwave source in CPT atomic clock. For example, the method lowers the requirement for the high frequency resolution of microwave source, thus a PLL chip with lower power consumption, cost and frequency resolution can be used to implement a chip-scale atomic clock with lower power consumption and cost, and without sacrificing performance.

2. Compared with the existing frequency modulation and demodulation method, the CPT signal and the error signal in the dispersion shape obtained by the present invention have the advantages that the frequency discrimination slope is increased, as well as the signal-to-noise ratio, thus it will improve the frequency stability of CPT atomic clock. Meanwhile, the capture range of frequency locking is increased, making it not easy to unlock, thus it enhances the robustness of atomic clock to external disturbances.

BRIEF DESCRIPTION OF THE DRAWINGS

In FIG. 2, 1—a direct current source; 2—a microwave coupler (bias-tee); 3—a phase modulator; 4—a microwave signal source; 5—a high modulation bandwidth (>GHz) laser diode; 6—a quarter-wave plate ($\lambda/4$); 7—a quantum resonance systems; 8—a photodetector; 9—a signal processing system.

DETAILED DESCRIPTION

The present invention will be further described with reference to the accompanying drawings and embodiments, which include, but are not limited to, the following embodiments.

CPT is a quantum interference effect. In the field of atomic clocks application, it includes both active CPT and passive CPT. The quantum resonance system comprises a CPT resonance energy level structure from two ground states to the same excited state, and adapts to hydrogen atoms (H), alkali metals (Li, Na, K, Rb, Cs), $Hg^+$, $Ca^+$, $Yb^+$, $Ba^+$ or fullerene (C-60) particles, the particles being in a gaseous hot atom, gaseous cold atom, gaseous atomic beam, ion, molecular or plasma state. The invention takes the passive CPT based vapor cell atomic clock, in which a continuous laser interacts with $^{87}Rb$ atom ensemble, as an example to describe the specific implementation mode of the invention. But the present invention is not limited thereto, and the applicable scope covers all the configurations described above.

Figure 1:
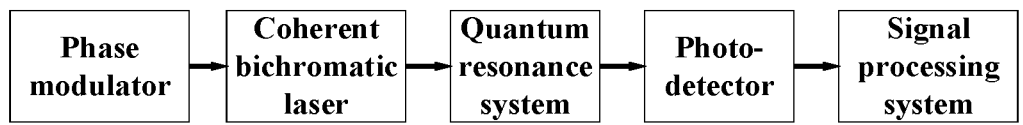
FIG. 1 is a schematic diagram of the principle of the present invention.

The invention discloses a CPT phase modulation and demodulation method, as shown in FIG. 1, which comprises the following steps: Generating a coherent bichromatic light, in which the relative phase between the two frequency components is modulated with modulation depth equal to $\pi/2$. The phase modulated coherent bichromatic light interacts with a quantum resonance system, and prepares it alternately into two inverted CPT states. Detected the transmitted light with a photodetector, two inverted dispersive CPT signals are observed in two successive detection windows. With synchronous phase demodulation, a CPT error signal is obtained, which is used for locking the local oscillator to realize a CPT atomic clock.

The CPT phase modulation and demodulation method provided by the embodiment of the invention comprises the following steps:

1) providing a coherent bichromatic light.

2) modulating the relative phase between the two frequency components in the coherent bichromatic light, wherein the modulation depth is $\pi/2$ and the modulation period is at the same order of the ground states coherence time, for maximizing the contrast of CPT signal.

3) interacting the phase modulated coherent bichromatic light with a quantum resonance system, then the quantum resonance system is prepared alternately into two inverted dispersive CPT states.

4) converting coherent bichromatic light transmitted from the quantum resonance system into an electric signal by a photodetector, demodulating the electric signal to obtain an error signal by two methods: Digital or analog demodulation.

For the digital demodulation, the photodetector electric signal is converted into digital signals through an analog-to-digital converter (ADC), signals in two successive detection windows during phase switching in each phase modulation period are collected, averaged respectively and subtracted to obtain an error signal. The duration of the two successive detection windows is $t_{w1}$ and $t_{w2}$ respectively, the $t_{w1}$ window is located at the initial moment of CPT state before phase switching, the $t_{w2}$ window is located at the moment of phase switching, the duration of $t_{w1}$ and $t_{w2}$ is usually not more than 1 ms for a high CPT signal contrast. After the error signal is processed through a proportional-integral-derivative (PID) algorithm, an analog error signal is generated by a digital-to-analog converter (DAC) and used to feedback and lock the frequency of local oscillation, and finally an atomic clock is realized.

Figure 5:
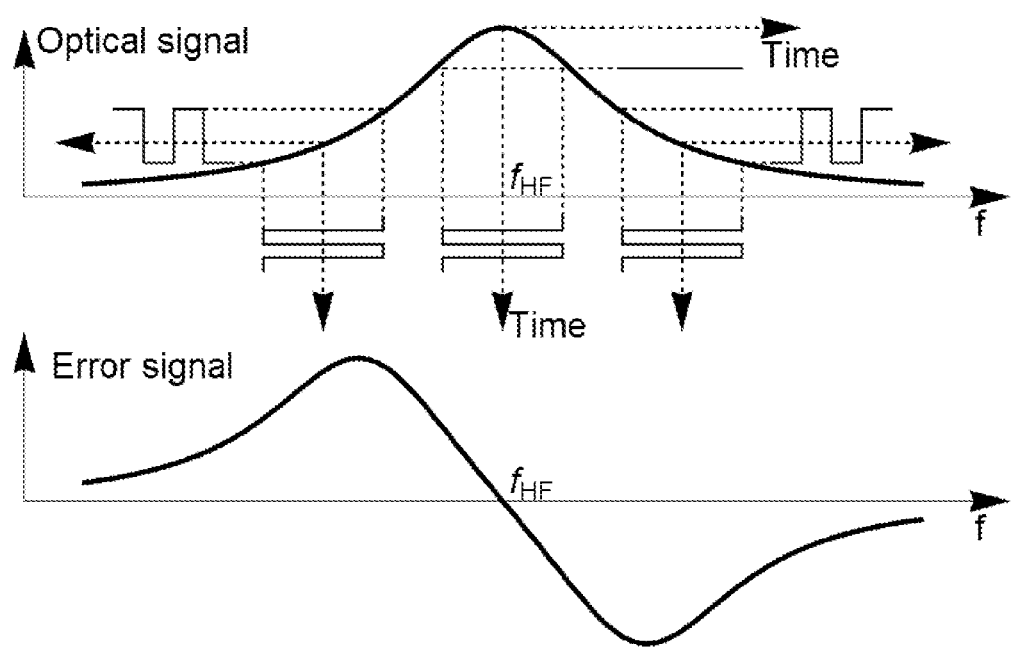
FIG. 5 illustrates a conventional frequency modulation and demodulation method.

For the analog demodulation, which is similar to the conventional frequency modulation and demodulation method shown in FIG. 5, the photodetector electric signal is multiplied by a square wave which is synchronous to the phase modulation, this multiplication can be implemented by an analog mixer. A low-pass filter is used for filtering the high-frequency component, then an error signal is obtained.

Figure 2:
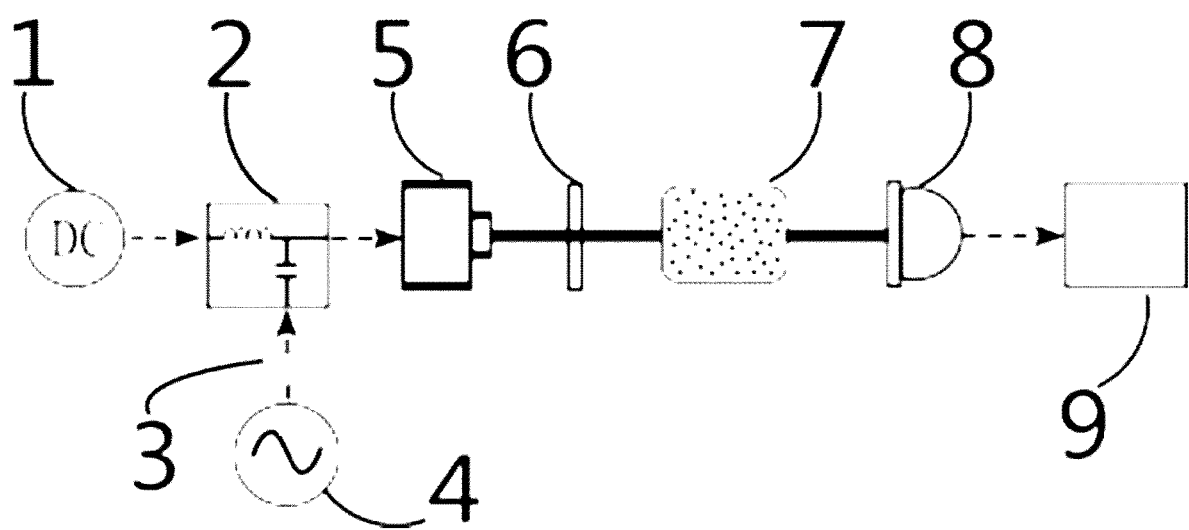
FIG. 2 is a schematic view of the system of the present invention.

As shown in FIG. 2, the embodiment of the present invention further discloses a physical system for CPT phase modulation and demodulation.

In the system, a direct current source 1 drives a laser diode system 5 and tunes its output light wavelength to a proper position of atomic resonance. A microwave signal source 4 is coupled to the laser diode through a microwave coupler 2 and modulates its output light frequency. Then a multicolor light is generated by the laser diode 5. The ±1st order sidebands of the multicolor light form the desired coherent bichromatic light, which is used for CPT states preparation and detection, while other frequency components do not interact with an atomic system obviously and exist only as the detection background.

The phase modulator 3 implements phase modulation on the microwave signal source 4, i.e., switches phase between $\varphi+0$ and $\varphi+\pi/4$ according to design rule, where $\varphi$ is the initial arbitrary phase. Correspondingly, the relative phase of the coherent bichromatic light is switched between $\phi+0$ and $\phi+\pi/2$, where $\phi$ is the initial arbitrary phase.

The phase-modulated coherent bichromatic light passes through a $\lambda/4$ wave plate 6 and converts its polarization to a circular polarization. Then the phase-modulated coherent bichromatic light interacts with a quantum resonance system 7 and prepares it alternately into two inverted CPT states.

Figure 4:
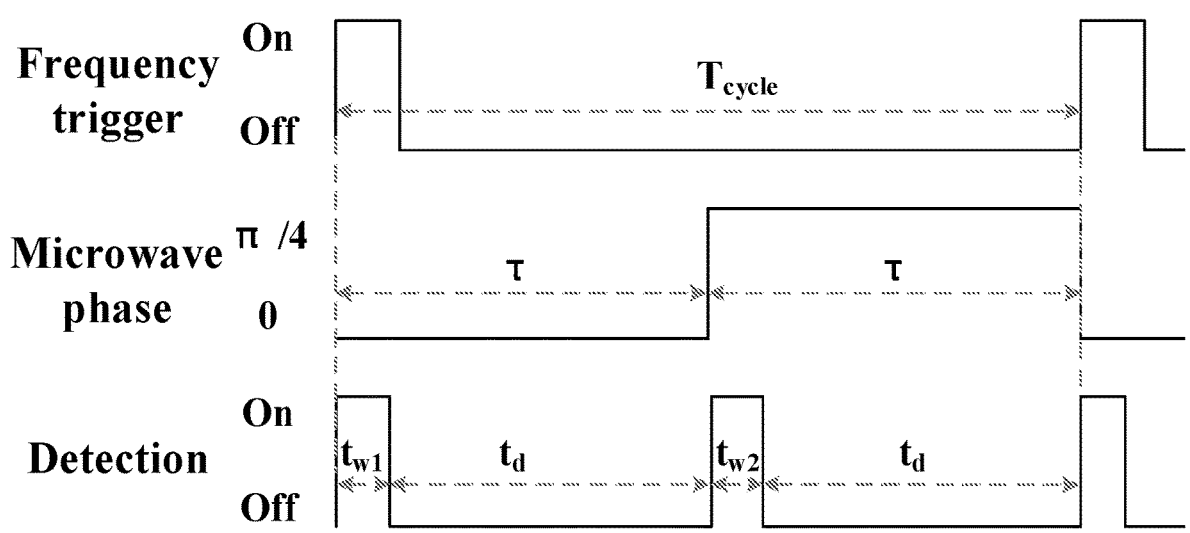
FIG. 4 is a timing diagram illustrating the operation of the present invention.
Figure 6:
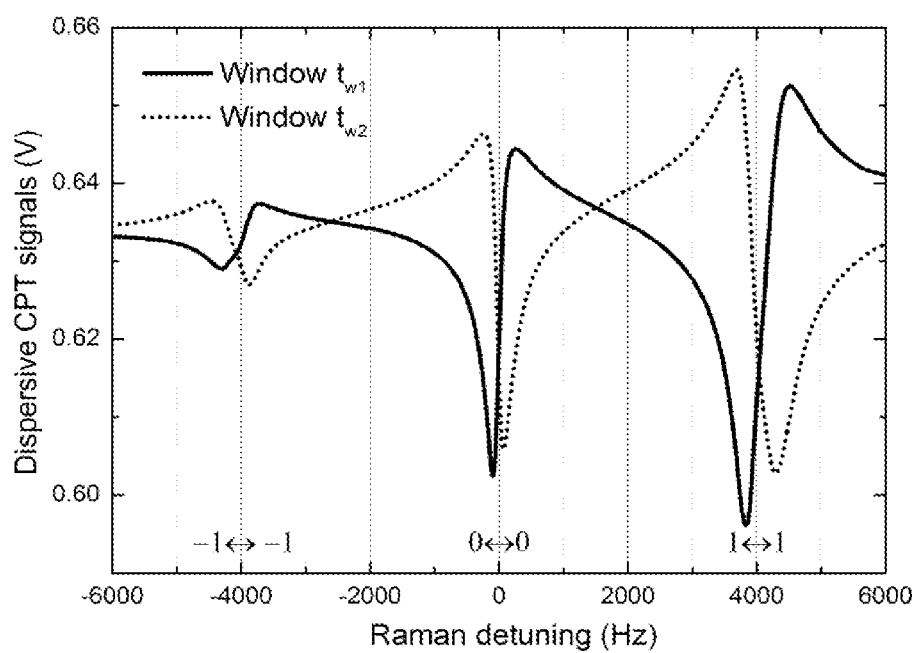
FIG. 6 is a plot of typical dispersive CPT signals in two detection windows obtained by the present invention.
Figure 7:
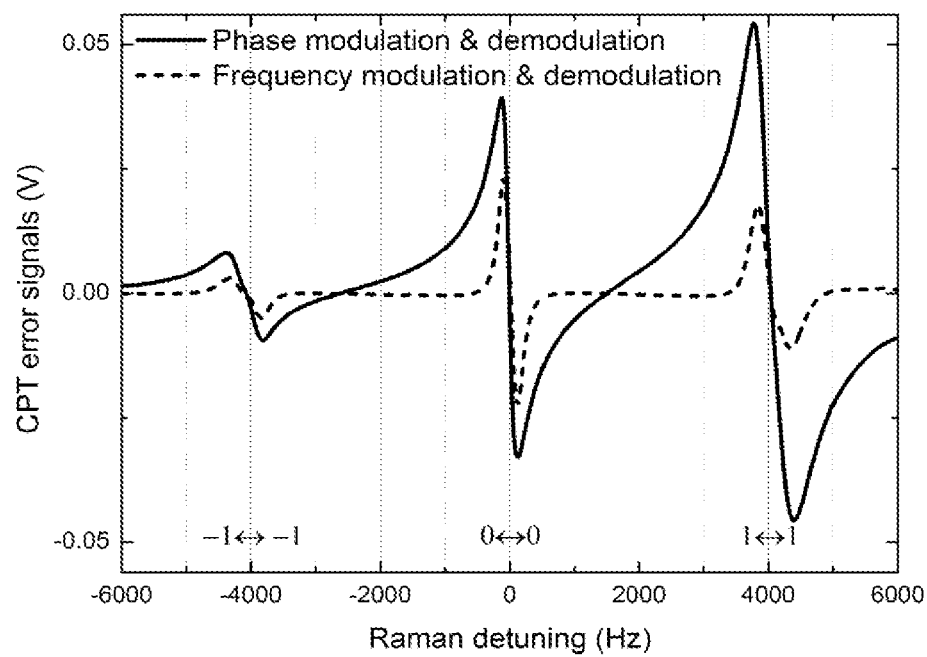
FIG. 7 is a plot of a typical CPT error signal obtained by phase modulation and demodulation in accordance with the present invention. For comparison, the figure also shows the error signal obtained by the conventional frequency modulation and demodulation method under the same conditions.

Converted the transmitted light into electric signal by a photodetector 8 and sent it to a signal processing system 9, an error signal can be obtained through synchronous phase demodulation with a digital or analog method. Take digital phase demodulation method for example, as shown in FIG. 4, the photodetector electric signals are converted into digital signals through an analog-to-digital converter (ADC). Signals in two successive detection windows during phase switching in each phase modulation period are collected, averaged respectively, then two CPT signals with inverted dispersive shape are observed, as shown in FIG. 6. An error signal is obtained by subtracting the two CPT signals, as shown by the solid line in FIG. 7. After the error signal is processed through a proportional-integral-derivative (PID) algorithm, the analog error signal is generated by a digital-to-analog converter (DAC) and used to feedback and lock the frequency of local oscillation, and finally an atomic clock is realized.

Figure 3:
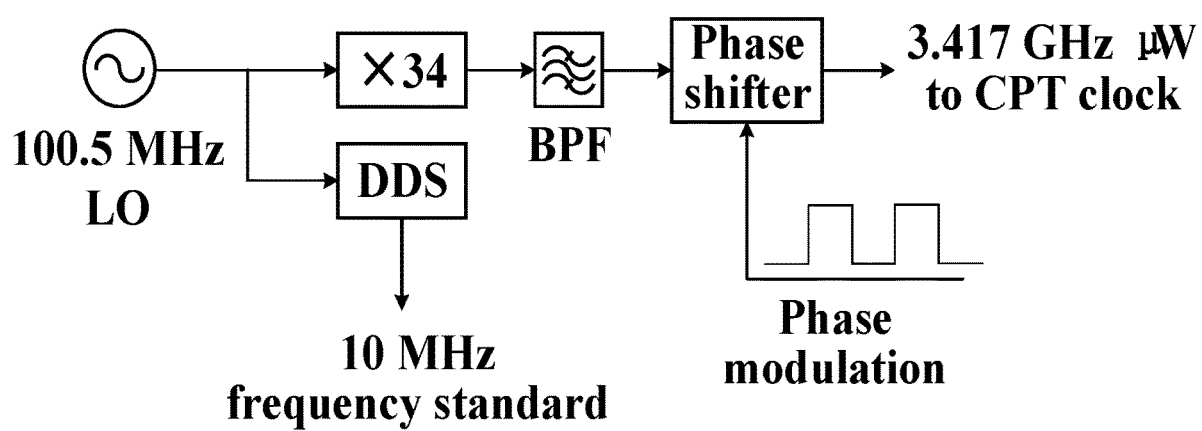
FIG. 3 is a schematic view of new designed microwave source for CPT atomic clock based on the present invention.

The invention uses a phase rather than a frequency modulation, thus it offers a new design concept for microwave source, as shown in FIG. 3, in which the LO, ×34, BPF and DDS are abbreviations for local oscillator, frequency multiplier, band-pass filter and direct digital frequency synthesis, respectively. This design gives an example of a low phase noise and simple structure microwave source for CPT clock.

The coherent bichromatic light source can be obtained by means of frequency locking of two independent lasers, external modulation (such as EOM, AOM and the like), internal modulation (direct-modulated lasers) and the like, wherein the microwave frequency used for the modulation is $v_{hf}/n$, $v_{hf}$ for the clock transition frequency, n for a positive integer. The invention takes the half-wave modulation for example, in which the coherent bichromatic light is generated by the direct modulation of a high modulation bandwidth laser diode with microwave frequency around $v_{hf}/2$.

In the invention, the phase modulator dynamically controls the relative phase of the two frequency components of bichromatic light with the modulation depth is $\pi/2$. This can be realized by a phase shifter, a direct digital frequency synthesizer (DDS) or a phase-locked loop (PLL).

In the invention, the phase modulation of coherent bichromatic light can be implemented by a square-wave or sine-wave modulation.

What is claimed is:

1. A CPT phase modulation and demodulation method is characterized by comprising the following steps:
   1) providing a coherent bichromatic light;
   2) modulating the relative phase of the two frequency components in the coherent bichromatic light, wherein the modulation depth is $\pi/2$, the modulation period of the relative phase modulation is at the same order of the ground states coherence time, for maximizing the contrast of CPT signal;
   3) interacting the phase modulated coherent bichromatic light with a quantum resonance system alternately between two inverted dispersive CPT states and adopting an active CPT or passive CPT configuration;
   4) converting the coherent bichromatic light transmitted from the quantum resonance system into an electric signal by a photodetector, demodulating synchronously the electric signal to obtain an error signal, feeding back and locking the local oscillation frequency, and realizing an atomic clock.

2. A CPT phase modulation and demodulation method of claim 1, wherein the quantum resonance system comprises a CPT resonance energy level structure from two ground states to the same excited state, and adopts hydrogen atoms (H), alkali metals (Li, Na, K, Rb, Cs), $Hg^+$, $Ca^+$, $Yb^+$, $Ba^+$ or fullerene (C-60) particles, with the particles in a gaseous hot atom, gaseous cold atom, gaseous atomic beam, ion, molecular or plasma state.

3. A CPT phase modulation and demodulation method of claim 1, where in step 4) the error signal can be obtained with digital or analog demodulation.

4. A CPT phase modulation and demodulation method of claim 1, wherein the CPT error signal of the clock transitions is applied to the CPT atomic clock, while the CPT error signal of the non-clock transitions is applied to the atomic magnetometer, both the CPT error signals of clock and non-clock transition can be applied to atomic precision spectroscopy.

5. A CPT phase modulation and demodulation system for implementing the method of claim 1, comprising a direct current source, a microwave coupler (bias-tee), a phase modulator, a microwave signal source, a laser diode, a quarter-wave plate, a quantum resonance system, a photodetector and a signal processor, wherein: the direct current source supplies power to the laser diode; a microwave signal source sends phase modulated microwave signal by a phase modulator to the laser diode through a microwave coupler; coherent bichromatic light emitted by the laser diode passes through a quarter-wave plate to obtain circularly polarized coherent bichromatic light.

6. A CPT phase modulation and demodulation system of claim 5, wherein the coherent bichromatic light can be circularly polarized laser light, a pair of parallel and linearly polarized laser light, a pair of orthogonally and linearly polarized laser light, push-pull optical pumping CPT or double modulation CPT.

* * * * *